United States Patent
Augustine et al.

(10) Patent No.: US 9,734,880 B1
(45) Date of Patent: Aug. 15, 2017

(54) APPARATUSES, METHODS, AND SYSTEMS FOR STOCHASTIC MEMORY CIRCUITS USING MAGNETIC TUNNEL JUNCTIONS

(71) Applicant: Intel Corporation, Santa Clara, CA (US)

(72) Inventors: Charles Augustine, Portland, OR (US); Somnath Paul, Hillsboro, OR (US); Sadique Ul Ameen Sheik, San Diego, CA (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/088,419

(22) Filed: Apr. 1, 2016

(51) Int. Cl.
*G11C 11/00* (2006.01)
*G11C 11/16* (2006.01)
*G06N 5/02* (2006.01)

(52) U.S. Cl.
CPC ............ *G11C 11/161* (2013.01); *G06N 5/025* (2013.01); *G11C 11/1675* (2013.01)

(58) Field of Classification Search
CPC .... G11C 11/00; G11C 11/161; G11C 11/1675
USPC ....... 365/48, 55, 62, 66, 74, 78, 80–93, 100, 365/130, 131, 148, 158, 171–173, 209, 365/213, 225.5, 230.07, 232, 243.5; 977/933–935
See application file for complete search history.

(56) References Cited

U.S. PATENT DOCUMENTS

| | | | |
|---|---|---|---|
| 6,903,965 B2 | 6/2005 | Ishikawa | |
| 7,173,846 B2 | 2/2007 | Lin et al. | |
| 7,978,510 B2 | 7/2011 | Modha et al. | |
| 8,606,732 B2 | 12/2013 | Venkatraman et al. | |
| 8,755,222 B2* | 6/2014 | Kent | G11C 11/16 365/130 |
| 9,111,222 B2 | 8/2015 | Aparin | |
| 2008/0112094 A1* | 5/2008 | Kent | G11C 11/5607 360/324.11 |
| 2009/0296462 A1* | 12/2009 | Kent | G11C 11/16 365/171 |

(Continued)

OTHER PUBLICATIONS

Seung, H. Sebastian; "Learning in spiking neural networks by reinforcement of stochastic synaptic transmission"; Neuron; Dec. 18, 2003; pp. 1063-1073, vol. 40.

(Continued)

*Primary Examiner* — Harry W Byrne
(74) *Attorney, Agent, or Firm* — Schwabe, Williamson & Wyatt, P.C.

(57) ABSTRACT

Embodiments include apparatuses, systems, and methods including a memory apparatus including a plurality of bit cells, wherein each of the plurality of bit cells correspond to a respective weight value and include a switch device that has a magnetic tunnel junction (MTJ) or other suitable resistive memory element to produce stochastic switching. In embodiments, the switch device may produce a switching output according to a stochastic switching probability of the switch device. In embodiments, a bit line or a source line passes a current across the MTJ for a switching time associated with the stochastic switching probability to produce the switching output which enables a determination of whether the respective weight value is to be updated. Other embodiments may also be described and claimed.

8 Claims, 5 Drawing Sheets

(56) References Cited

U.S. PATENT DOCUMENTS

| | | | | | |
|---|---|---|---|---|---|
| 2012/0294078 | A1* | 11/2012 | Kent | ............ | G11C 11/16 365/171 |
| 2013/0121067 | A1* | 5/2013 | Kent | ............ | G11C 11/16 365/158 |
| 2014/0233306 | A1* | 8/2014 | Kent | ............ | G11C 11/16 365/158 |
| 2015/0357015 | A1* | 12/2015 | Kent | ............ | G11C 11/16 365/158 |

OTHER PUBLICATIONS

Tkacik, Thomas E.; "A Hardware Random Number Generator", Cryptographic Hardware and Embedded Systems, 2002; pp. 450-453.
Zhao et al.; "Spin-Transfer Torque Switching Above Ambient Temperature", IEEE Magnetics Letter; (2012); 4 pages.
Srinivasa et al.; "Unsupervised discrimination of patterns in spiking neural networks with excitatory and inhibitory synaptic plasticity"; Frontiers of Computation Neuroscience; Dec. 15, 2014; 23 pages, vol. 8.
Mead, Carver; "Analog VLSI and Neural Systems"; Jan. 1, 1989; pp. 103-133 and 239-246; Addison Wesley Publishing Company.
Yu et al.; "On the Stochastic Nature of Resistive Switching in Metal Oxide RRAM: Physical Modeling, Monte Carlo Simulation, and Experimental Characterization"; (2011); IEDM Tech.; pp. 413-416.
Neftci et al.; "Event-Driven Contrastive Divergence for Spiking Neuromorphic Systems"; Dec. 19, 2013; Frontiers in Neuroscience; 31 pages.
International Search Report and Written Opinion mailed Jun. 15, 2017 for International Application No. PCT/US2017/020194, 15 pages.

\* cited by examiner

APPARATUSES, METHODS, AND SYSTEMS FOR STOCHASTIC MEMORY CIRCUITS USING MAGNETIC TUNNEL JUNCTIONS

FIELD

Embodiments of the present invention relate generally to the technical field of electronic circuits, and more particularly to stochastic memory circuits having magnetic tunnel junctions.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Spiking Neural Networks (SNNs) are regarded as the third generation of artificial neural networks (ANNs). In SNNs as well as ANNs, connections between units may be represented by a number called a weight value which can be positive or negative. The higher the weight value, the stronger the connection. These connections may be referred to as input synapses as they may correspond to the way actual neurons influence one another across biological synapses. It has been shown that in SNNs, efficient learning has been enabled by algorithms or learning rules that rely on stochasticity in neurons' membrane potentials and input synapse weights. In existing solutions, however, stochasticity in SNNs is enabled using standard complementary metal-oxide semiconductor (CMOS) hardware which has large area and power overhead.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
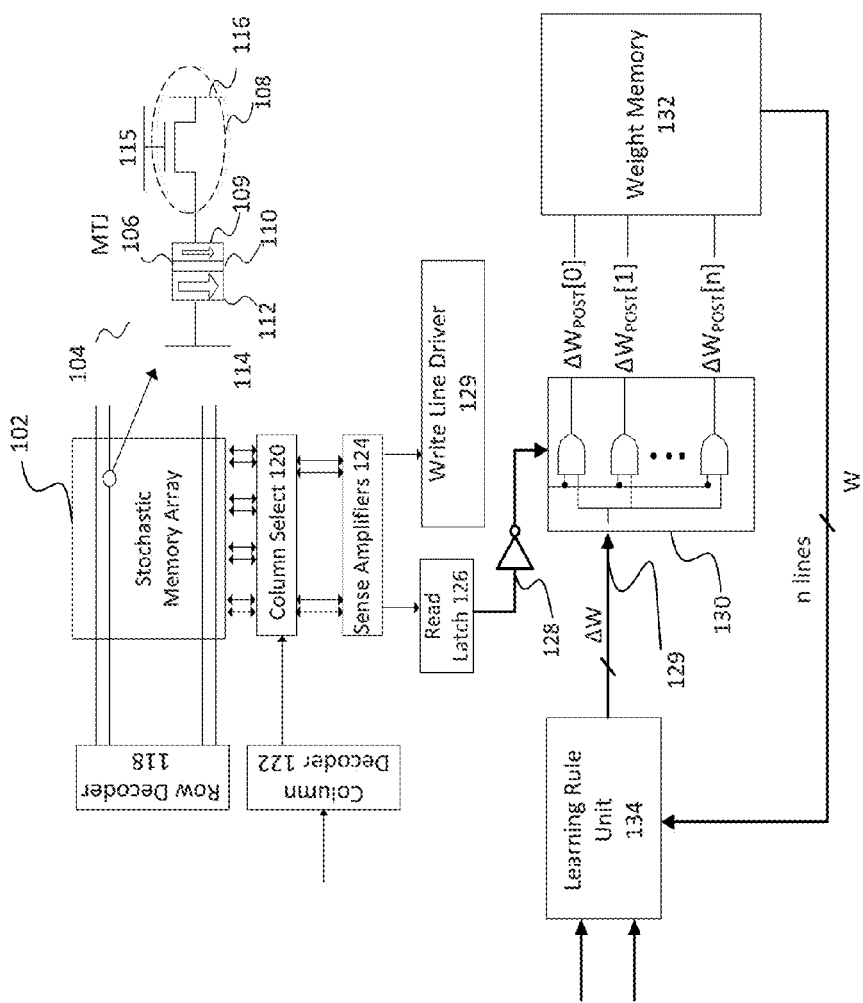
FIG. 1 illustrates an example circuit including a stochastic memory array in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments described herein include a memory array including a plurality of bit cells. In some embodiments, individual bit cells of the plurality of bit cells may correspond to a respective weight value and include a switch or switching device that has a magnetic tunnel junction (MTJ). The switching device may produce a switching output according to a stochastic switching probability of the MTJ. In embodiments, a bit line may be coupled to the switch device at a first layer of the MTJ and a source line may be coupled to the switch device at a second layer of the MTJ. In embodiments, the bit line or the source line passes a current across the MTJ for a switching time associated with the stochastic switching probability to produce a switching output. In embodiments, the switching output enables a determination of whether the respective weight value is to be updated. In some embodiments, the respective weight value may correspond to a respective strength of a connection signal or input synapse in an artificial neural network (ANN) such as a spiking neural network (SNN).

FIG. 1 illustrates circuit 100 including a stochastic memory array in accordance with various embodiments. In embodiments, an example stochastic memory array 102 may include a plurality of bit cells such as example bit cell 104. In embodiments, individual bit cells may be associated with a respective weight value, such as for example, a weight of an input synapse in a spiking neural network (SNN). In embodiments, bit cell 104 may include a switch or switching device that includes a magnetic tunnel junction (MTJ) 106 coupled to an access transistor, such as an N-channel metal-oxide-semiconductor (NMOS)-field-effect transistor 108 ("NMOS 108"). In embodiments, NMOS 108 may be coupled to a bit line (BL) 114, a word line (WL) 115, and a source line (SL) 116. As shown, for the embodiment, MTJ 106 may include a free layer 109 and a reference or fixed layer 112 on first and second respective sides of MTJ 106. An insulating layer 110 may be a middle layer between free layer 109 and fixed layer 112. In the embodiment shown, free layer 109 may be coupled to a drain terminal of NMOS 108 while fixed layer 112 may be coupled to BL 114. As illustrated, SL 116 may be coupled to a source terminal of NMOS 108. In the embodiment, stochastic memory array 102 also may be coupled to a row decoder 118, a column select 120, a column decoder 122, sense amplifiers 124, a read latch 126, and a write line driver 129 in order to assist with read and write operations. In various embodiments, stochastic memory array 102 may be a spin-transfer torque random-access memory (STT-RAM) array.

In embodiments, a current flowing from BL 114 to SL 116 may switch a relative magnetic orientation or direction of free layer 109 to a parallel direction or "P state" while a current from SL 116 to BL 114 may switch the relative magnetic direction of free layer 109 to an anti-parallel direction or "AP state". In embodiments, the AP state may be associated with a high-resistance state of MTJ 106, while the P state may be associated with a low-resistance state of MTJ 106. Note that in the example illustrated in FIG. 1, MTJ 106 may be in a low-resistance P state. In embodiments, for illustrative purposes, the P state may be defined as a logic "0" and the AP state as a logic "1." Accordingly, in embodiments, a current from BL 114 or SL 116 may pass across MTJ 106 for a sufficient duration of time ("switching time") to write bit cell 104 by switching the magnetic direction of free layer 109. In embodiments, the switching time may be associated with a stochastic switching probability of an MTJ. In embodiments, the stochastic switching probability may be influenced by various factors such as, for example, thermal fluctuation noise.

Figure 2:
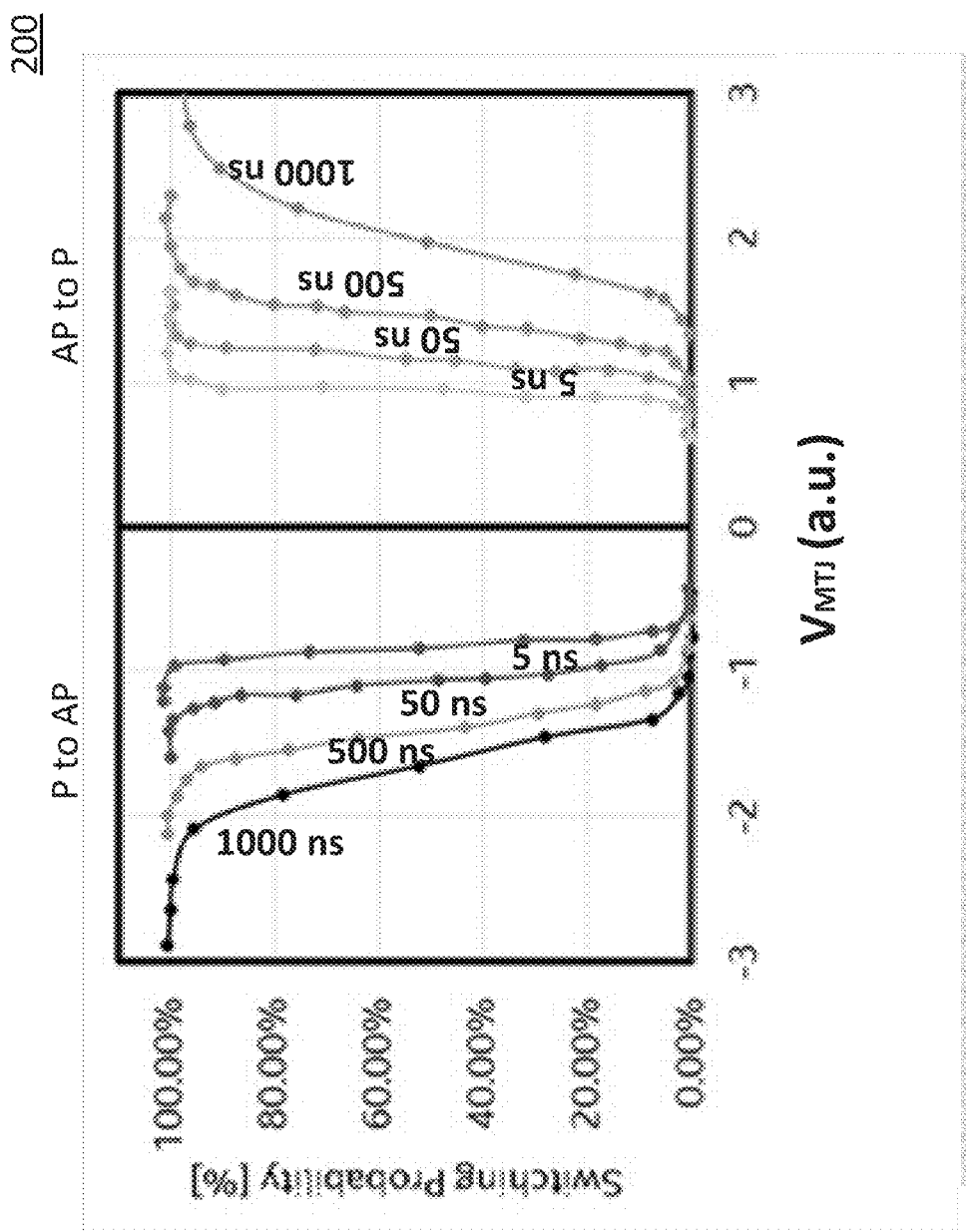
FIG. 2 is a graph displaying stochastic switching probabilities associated with the circuit of FIG. 1.

Accordingly, FIG. 2 is a Graph 200 which illustrates stochastic switching probability curves associated with an MTJ. In Graph 200, a vertical axis measures stochastic switching probability in percentage terms while a horizontal axis measures a voltage $V_{mtj}$ across the MTJ in arbitrary units (a.u.). The different lines of Graph 200 correspond to different perturbation times (e.g., the length of time for which the voltage $V_{mtj}$ is placed across the MTJ. Lines are shown for perturbation times of 5 nanoseconds (ns), 50 ns, 500 ns, and 1000 ns, as labeled in Graph 200. In embodiments, a stochastic switching probability may be selected and based on the switching probability curve for parallel to anti-parallel switching ("P→AP") or anti-parallel to parallel ("AP→P") switching, a corresponding $V_{mtj}$ may be determined. For example, a switching probability of approximately 50% may be achieved by selecting a perturbation time ($t_{PERTURB}$) of 1000 nanoseconds (ns), and a $V_{mtj}$ of 2 a.u. to be applied across the MTJ.

To further illustrate, in an embodiment where stochastic memory array 102 may include n bit cells corresponding to n respective weight values, n MTJs may be initialized to an AP state. In embodiments, if n=1024, a same write voltage of $V_{AP \to P}$ may be applied to substantially each of 1024 MTJs and may result in 512 or 50% of the 1024 MTJs switching from the AP state to the P state. Accordingly, for bit cells having an MTJ that has switched to the P state, a corresponding weight value W(i); i=0, . . . , n−1, (or, hereinafter, "W") may be updated with a weight value difference ΔW(i); i=0, . . . , n−1, (or, hereinafter "ΔW") received by logic circuit 130 from learning rule unit 134. For example, returning to FIG. 1, sense amplifiers 124 may read a state of MTJ 106 as a P state, and thus, e.g., logic "0." Sense amplifiers 124 may then provide a signal to read latch 126 and in turn, inverter 128. Inverter 128 may provide an inverted signal to an input terminal of logic circuit 130. Accordingly, for example, based on a switching output of "0," logic circuit 130 may determine that the respective weight value corresponding to bit cell 104 may be updated with the weight value difference ΔW.

As noted above and shown in FIG. 1, in embodiments, logic circuit 130 may be coupled to receive the weight value difference ΔW from learning rule unit 134. Note that learning rule unit 134 may calculate or determine the weight value difference ΔW by applying an algorithm or learning rule using weight value W. In embodiments, the learning rule may be a spike-timing-dependent plasticity (STDP) rule associated with an SNN model. As shown in FIG. 1, learning rule unit 134 may be coupled to receive weight value W from weight memory 132. Accordingly, note that learning rule unit 134 may calculate the weight value difference ΔW for each bit cell of memory cell array 102 regardless of whether weight value W is to be updated by logic circuit 130 with the weight value difference ΔW. In embodiments, logic circuit 130 may include a plurality of AND gates to receive the inverted switching output from inverter 128 and ΔW from learning rule unit 134 and to generate $\Delta W_{post}[0], \ldots, \Delta W_{post}[n-1]$ or hereinafter "$\Delta W_{post}$." In embodiments, weight memory 132 may be coupled to an output terminal of logic circuit 130 to receive $\Delta W_{post}$ and to store a plurality of weight values W that are updated. Note that in embodiments, for a current weight value W[n] for a bit cell n that is not to be updated with weight value, $\Delta W_{post}[n]=0$.

Although the operation of circuit 100 is illustrated herein using MTJs, it will be apparent that the circuit may be used with any suitable switching devices such as other resistive RAM (RRAM) technologies that may produce a switching output according to a stochastic switching probability.

Figure 3:
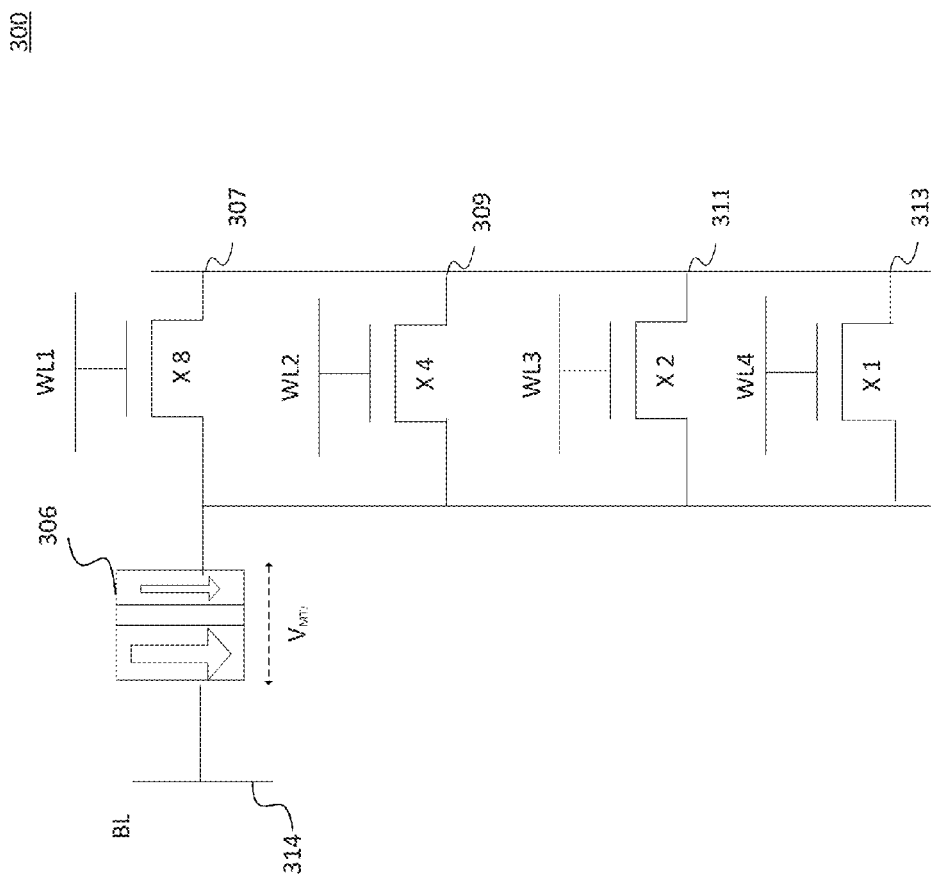
FIG. 3 illustrates an example bit cell that may be included in the circuit of FIG. 1 in accordance with various embodiments

Next, FIG. 3 illustrates a bit cell 300 that may be included in example stochastic memory array 102 in accordance with various embodiments. In embodiments, bit cell 300 may include a switching device including a plurality of transistors, such as for example, a first NMOS 307, a second NMOS 309, a third NMOS 311, and a fourth NMOS 313, each having a different drive strength from each other and each having a drain terminal coupled to an MTJ 306. In embodiments, MTJ 306 may also be coupled to BL 314. As illustrated, first NMOS 307, second NMOS 309, third NMOS 311, and fourth NMOS 313 may be coupled to a respective word line, WL1, WL2, WL3, and WL4. In the embodiment shown, the drive strength of each of the plurality of transistors may increase in strength by a factor of two relative to the transistor below it. Accordingly, bit cell 300 may have a programmable write voltage depending on an activation of WL1-WL4. In embodiments, the programmable write voltage may provide variance in a stochastic switching probability for the bit cells. Thus, in embodiments, a weight value W of a bit cell may be updated accordingly. Although the configuration of bit cell 300 is illustrated herein with four NMOS transistors with relative drive strengths increasing in a particular order, it will be apparent that variance in a number, drive strength, arrangement, and type of transistor may be contemplated.

Figure 4:
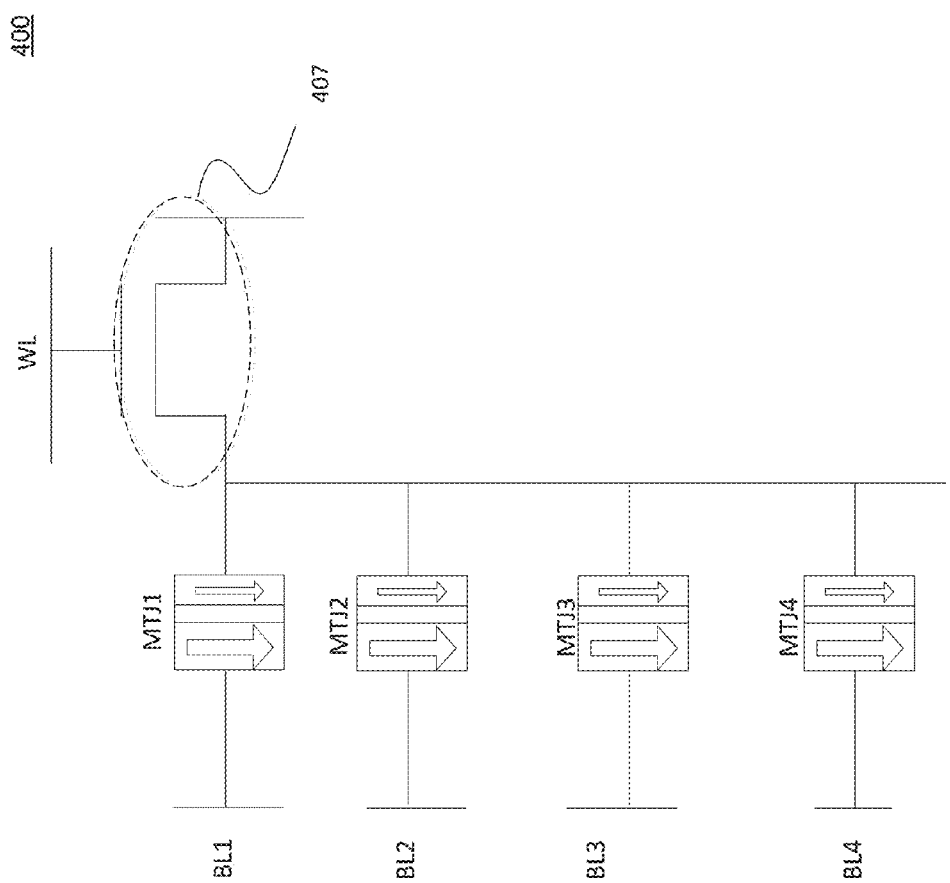
FIG. 4 illustrates another example bit cell that may be included in the circuit of FIG. 1 in accordance with various embodiments

FIG. 4 illustrates another example bit cell that may be included in a stochastic memory array 102. In embodiments, a bit cell 400 may include a plurality of MTJs coupled to a drain of NMOS 407. In the embodiment, MTJ2, MTJ3, and MTJ4 may be coupled in parallel to MTJ1 to enable a programmable write voltage for bit cell 400. In embodiments, a number of MTJs coupled in parallel may be increased so that a voltage across each MTJ may be modulated for a given supply voltage. Accordingly, in embodiments, bit line voltages may be controlled via BL1-BL4 coupled to each of respective MTJ1-MTJ4 to obtain a programmable write voltage that may be changed during a run time. Similar to the embodiment of FIG. 3, programmable write voltage may provide variance in a stochastic switching probability for a bit cell. Thus, in embodiments, a weight value W may be updated accordingly. Note that in embodiments, although the configuration of bit cell 400 is illustrated herein with four MTJs coupled to an NMOS transistor, it will be apparent that variance in a number of MTJs, arrangement, type of switching device, and/or type of resistive switching element may be contemplated.

Although FIGS. 1-4 above are discussed herein using specific examples including one or more NMOS transistors, it is apparent that in various embodiments circuit configurations using P-channel metal-oxide-semiconductor (PMOS)-field-effect transistors may be utilized as well. In various other embodiments, any suitable type of transistor or switch device to allow stochastic switching may also be contemplated. Furthermore, note that in embodiments, a circuit similar to circuit 100 may be used to determine whether neuron membrane potential updates and/or synapse connectivity updates occur. For example, in leaky integrate and fire neurons, neuron membrane potential may or may not be updated based upon timing of arrival of spikes from input synapses. In embodiments, using probabilistic neuron potential update techniques ("drop connect"), a switching output of a stochastic memory array may determine whether or not synaptic inputs affect neuron membrane potential. Thus, in embodiments, weights may be associated with neuron membrane potential and synapse connectivity updates. In embodiments, such techniques may be shown to improve learning accuracy in Synaptic Sampling Machines (SSMs). In other embodiments, stochastic learning may contribute to higher classification accuracy in SNN's.

Figure 5:
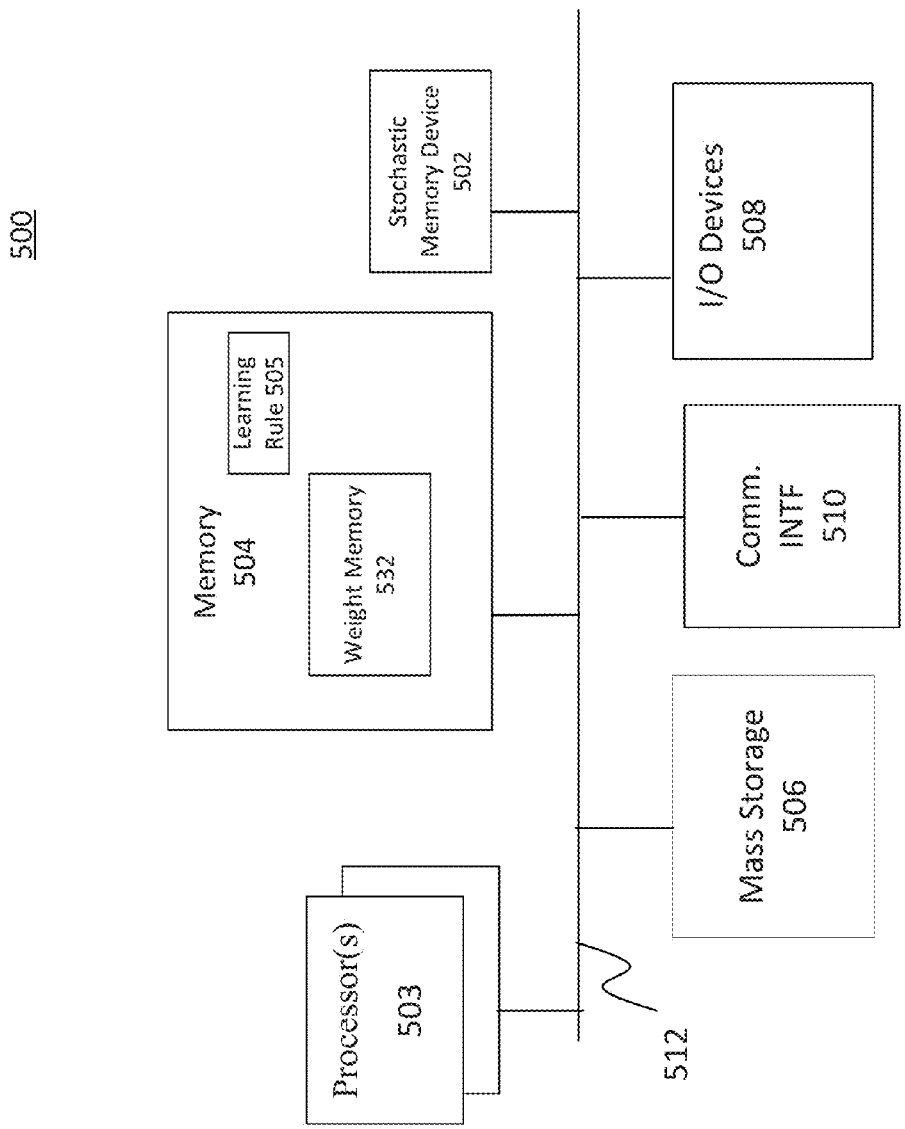
FIG. 5 illustrates an example system in accordance with various embodiments.

FIG. 5 illustrates an example computer system that may be suitable for use to practice selected aspects of the present disclosure. As shown, computer 500 may include one or more processors or processor cores 503, and a system memory 504. For the purpose of this application, including the claims, the term "processor" refers to a physical processor, and the terms "processor" and "processor cores" may be considered synonymous, unless the context clearly requires otherwise. Additionally, computer 500 may include a stochastic memory device 502, mass storage devices 506 (such as diskette, hard drive, compact disc read only memory (CD-ROM) and so forth), input/output devices 508 (such as display, keyboard, cursor control, remote control, gaming controller, image capture device, and so forth), and communication interfaces 510 (such as network interface cards, modems, infrared receivers, radio receivers (e.g., Bluetooth), and so forth). The elements may be coupled to each other via system bus 512, which may represent one or more buses. In the case of multiple buses, they may be bridged by one or more bus bridges (not shown). In embodiments, system memory 504 may include a weight memory 532 similar to weight memory 132 of FIG. 1. System memory 504 may also store a learning rule 505. In embodiments, learning rule 505 may be a STDP learning rule or algorithm.

Note that, in embodiments, an STDP learning rule in combination with processor(s) 503 may comprise an STDP learning unit.

In embodiments, stochastic memory device 502 may include a stochastic memory array such as stochastic memory array 102 and one or more circuit elements of circuit 100 of FIG. 1. Accordingly, system 500 may include a stochastic memory array having an output terminal and a plurality of bit cells, each of the plurality of bit cells corresponding to a weight value and including a switch device having a resistive property. In embodiments, the switch device may produce a stochastic switching output signal. System 500 may further include a logic circuit having an input terminal and an output terminal coupled at the input terminal to the output terminal of the stochastic memory array to receive the stochastic switching output signal and based in part on the stochastic switching output signal, to determine whether the weight value is to be updated. In embodiments, a weight memory such as weight memory 532 may be coupled to the output terminal of the logic circuit to receive and store the updated weight value, if the weight value is to be updated and a processor such as processor(s) 503 may be coupled to the weight memory 532 to access the updated weight value, if the weight value is to be updated, and to apply a learning rule to the updated weight value. In embodiments, the learning rule may be a learning rule such a learning rule 505. Note that in some embodiments, weight memory 532 may be a weight memory array that may be merged with stochastic memory array 502 in order to significantly reduce overhead.

Note that in embodiments, communication interfaces 510 may include a one or more communications chips and may enable wired and/or wireless communications for the transfer of data to and from the computing device 500. In embodiments, communication interfaces 510 may include a transceiver including a transmitter and receiver or a communications chip including the transceiver. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication interfaces 510 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The communication interfaces 510 may include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, Ev-DO, and others.

The elements may be coupled to each other via system bus 512, which may represent one or more buses. In the case of multiple buses, they may be bridged by one or more bus bridges (not shown). Each of these elements may perform its conventional functions known in the art. The number, capability and/or capacity of these elements 508-510 may vary, depending on whether computer 500 is used as a mobile device, a stationary device or a server. When used as mobile device, the capability and/or capacity of these elements 508-510 may vary, depending on whether the mobile device is a smartphone, a computing tablet, an ultrabook or a laptop. Otherwise, the constitutions of elements 508-510 are known, and accordingly will not be further described.

Some non-limiting Examples are provided below.

Example 1 is a memory apparatus comprising a plurality of bit cells, wherein individual bit cells of the plurality of bits cells correspond to a respective weight value and include a switch device that has a magnetic tunnel junction (MTJ), the switch device to produce a switching output according to a stochastic switching probability of the switch device; a bit line coupled to the switch device at a first layer of the MTJ; and a source line coupled to the switch device at a second layer of the MTJ, wherein at least one of the bit line or the source line passes a current across the MTJ for a switching time associated with the stochastic switching probability to produce the switching output, and wherein the switching output enables a determination of whether the respective weight value is to be updated.

Example 2 is the memory apparatus of Example 1, wherein respective weight values correspond to respective input synapses to a neuron in an artificial neural network (ANN), and wherein the plurality of bit cells comprises a plurality of spin-transfer torque (STT) random access memory (RAM) bit cells.

Example 3 is the memory apparatus of Example 1, wherein the first layer of the MTJ comprises a reference layer and the second layer comprises a free layer, and wherein the free layer of the MTJ is coupled to a drain terminal of an N-channel metal-oxide-semiconductor (NMOS)-field-effect transistor.

Example 4 is the memory apparatus of Example 3, wherein the NMOS-field-effect transistor is a first NMOS-field-effect transistor and is included in the switch device, and wherein the switch device further includes a second NMOS-field-effect transistor having a different drive strength than the first NMOS-field-effect transistor and having a drain terminal coupled to the MTJ.

Example 5 is the memory apparatus of Examples 1-4, further comprising a logic circuit coupled to the plurality of bit cells to receive the switching output from the plurality of bit cells, wherein the logic circuit determines whether the respective weight value is to be updated.

Example 6 is the memory apparatus of Example 1, further comprising an access transistor coupled between the source line and the MTJ and a word line coupled to the access transistor to enable the current to switch a magnetic direction of one of the first layer or the second layer of the MTJ from a parallel direction to an anti-parallel direction or to switch the magnetic direction one of the first layer or the second layer of the MTJ from the anti-parallel direction to the parallel direction.

Example 7 is the memory apparatus of Example 1, wherein the switch device comprises a programmable switch device to provide a variable write voltage to a bit cell.

Example 8 is the memory apparatus of Example 1, wherein the MTJ of the switch device is a first MTJ, and wherein the switch device further comprises at least a second MTJ and a third MTJ coupled in parallel to the first MTJ to enable a programmable write voltage for the respective bit cell.

Example 9 is a stochastic circuit, comprising at least one bit cell corresponding to a weight associated with an input signal, the at least one bit cell coupled between a bit line and a source line and including a switch device to produce a stochastic switching output signal; and a logic circuit coupled to receive the switching output signal from the at least one bit cell, and to determine whether the weight is to be updated based at least in part on the switching output signal.

Example 10 is the stochastic circuit of Example 9, wherein the at least one bit cell is included in a spin-transfer torque (STT) random access memory (RAM) memory array.

Example 11 is the stochastic circuit of Example 9, further comprising a weight memory array coupled to the logic circuit to receive an updated weight from the logic circuit.

Example 12 is the stochastic circuit of Examples 9-11, wherein the logic circuit further comprises an input terminal to receive a weight value from a spike-timing-dependent plasticity (STDP) learning unit.

Example 13 is the stochastic circuit of Example 9, wherein the switch device comprises an N-channel metal-oxide-semiconductor (NMOS)-field-effect transistor having a drain terminal coupled to a magnetic tunnel junction (MTJ).

Example 14 is the stochastic circuit of Example 13, wherein the MTJ is a first MTJ and wherein the stochastic circuit further comprises a second MTJ coupled in parallel to the first MTJ.

Example 15 is the stochastic circuit of Example 14, further comprising a third MTJ coupled in parallel to the first and the second MTJ.

Example 16 is a system, comprising a stochastic memory array having an output terminal and a plurality of bit cells, each of the plurality of bit cells corresponding to a weight value and including a switch device to produce a stochastic switching output signal; a logic circuit having an input terminal and an output terminal coupled at the input terminal to the output terminal of the stochastic memory array to receive the stochastic switching output signal and based in part on the stochastic switching output signal, to determine whether the weight value is to be updated; a weight memory array coupled to the output terminal of the logic circuit to receive and store the updated weight value, if the weight value is to be updated; and a processor coupled to the weight memory array to access the updated weight value from the weight memory array, if the weight value is to be updated, and to apply a learning rule to the updated weight value.

Example 17 is the system of Example 16, wherein the weight memory array is included in a memory that stores the learning rule, wherein the learning rule comprises a spike-timing-dependent plasticity (STDP) learning rule to calculate the weight value.

Example 18 is the system of Example 16, wherein the stochastic memory array is a spin-transfer torque (STT) random access memory (RAM) memory array.

Example 19 is the system of any one of Examples 17 and 18, wherein the stochastic memory array is a resistive random access memory (RAM) memory array.

Example 20 is a circuit, comprising means for producing a switching output signal according to a stochastic switching probability of a switching device, wherein the switching output signal is associated with a weight value; and means for determining whether an update to the weight value is to be applied.

Example 21 is the circuit of Example 20, further comprising means for storing the weight value.

Example 22 is the circuit of Example 20, further comprising means for calculating a change in the weight value.

Example 23 is the circuit of Example 22, wherein the means for calculating the change in the weight value comprises means for calculating a change in a neuron potential.

Although certain embodiments have been illustrated and described herein for purposes of description, this application is intended to cover any adaptations or variations of the embodiments discussed herein. Therefore, it is manifestly intended that embodiments described herein be limited only by the claims. Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A memory apparatus, comprising:
a plurality of bit cells, wherein individual bit cells of the plurality of bits cells correspond to a respective weight value and include a switch device that has a magnetic tunnel junction (MTJ), the switch device to produce a switching output according to a stochastic switching probability of the switch device;
a bit line coupled to the switch device at a first layer of the MTJ; and
a source line coupled to the switch device at a second layer of the MTJ, wherein at least one of the bit line or the source line passes a current across the MTJ for a switching time associated with the stochastic switching probability to produce the switching output, and wherein the switching output enables a determination of whether the respective weight value is to be updated.

2. The memory apparatus of claim 1, wherein respective weight values correspond to respective input synapses to a neuron in an artificial neural network (ANN), and wherein the plurality of bit cells comprises a plurality of spin-transfer torque (STT) random access memory (RAM) bit cells.

3. The memory apparatus of claim 1, wherein the first layer of the MTJ comprises a reference layer and the second layer comprises a free layer, and wherein the free layer of the MTJ is coupled to a drain terminal of an N-channel metal-oxide-semiconductor (NMOS)-field-effect transistor.

4. The memory apparatus of claim 3, wherein the NMOS-field-effect transistor is a first NMOS-field-effect transistor and is included in the switch device, and wherein the switch device further includes a second NMOS-field-effect transistor having a different drive strength than the first NMOS-field-effect transistor and having a drain terminal coupled to the MTJ.

5. The memory apparatus of claim 1, further comprising a logic circuit coupled to the plurality of bit cells to receive the switching output from the plurality of bit cells, wherein the logic circuit determines whether the respective weight value is to be updated.

6. The memory apparatus of claim 1, further comprising an access transistor coupled between the source line and the MTJ and a word line coupled to the access transistor to enable the current to switch a magnetic direction of one of the first layer or the second layer of the MTJ from a parallel direction to an anti-parallel direction or to switch the magnetic direction of one of the first layer or the second layer of the MTJ from the anti-parallel direction to the parallel direction.

7. The memory apparatus of claim 1, wherein the switch device comprises a programmable switch device to provide a variable write voltage to a bit cell.

8. The memory apparatus of claim 1, wherein the MTJ of the switch device is a first MTJ, and wherein the switch device further comprises at least a second MTJ and a third MTJ coupled in parallel to the first MTJ to enable a programmable write voltage for the respective bit cell.

* * * * *